United States Patent [19]

Parker et al.

[11] Patent Number: 5,035,787
[45] Date of Patent: Jul. 30, 1991

[54] METHOD FOR REPAIRING SEMICONDUCTOR MASKS AND RETICLES

[75] Inventors: Norman W. Parker, Westlake Village; William P. Robinson, Newbury Park; Robert L. Piccioni, Thousand Oaks, all of Calif.

[73] Assignee: MicroBeam, Inc., Newbury Park, Calif.

[21] Appl. No.: 453,413

[22] Filed: Dec. 18, 1989

Related U.S. Application Data

[62] Division of Ser. No. 53,318, Jul. 22, 1987, abandoned.

[51] Int. Cl.$^5$ .............................................. C23F 1/02
[52] U.S. Cl. ........................... 204/192.34; 204/298.36; 250/492.3
[58] Field of Search ...................... 204/192.11, 192.32, 204/192.34, 298.04, 298.36; 250/492.21, 423 R, 423 F, 492.3; 156/643, 156

[56] References Cited

U.S. PATENT DOCUMENTS

| 4,367,429 | 1/1983 | Wang et al. | 313/362.1 |
| 4,503,329 | 3/1985 | Yamaguchi et al. | 250/309 |
| 4,548,883 | 10/1985 | Wagner | 430/5 |
| 4,556,798 | 12/1985 | McKenna et al. | 250/492.2 |
| 4,641,034 | 2/1987 | Okamura et al. | 250/492.2 |

*Primary Examiner*—Nam X. Nguyen
*Attorney, Agent, or Firm*—Lyon & Lyon

[57] ABSTRACT

Apparatus and method for repairing semiconductor masks and reticles is disclosed, utilizing a focused ion beam system capable of delivering, from a single ion beam column, several different species of focused ion beams, each of which is individually optimized to meet the differing requirements of the major functions to be performed in mask repair. This method allows the mask to be imaged with high resolution and minimum mask damage. Opaque defects are removed by sputter etching at high rates with minimum damage to the mask substrate, and clear defects are filled in at high rates directly from the beam by deposition of a metallic or other substance compatible with the mask materials. A focused ion beam column able to produce precisely focused ion beams is employed and is operated at high energies for imaging and sputter etching, and at low energies for imaging and deposition. A liquid metal alloy source containing suitable atomic species is employed.

4 Claims, 5 Drawing Sheets

COLUMN SCHEMATIC

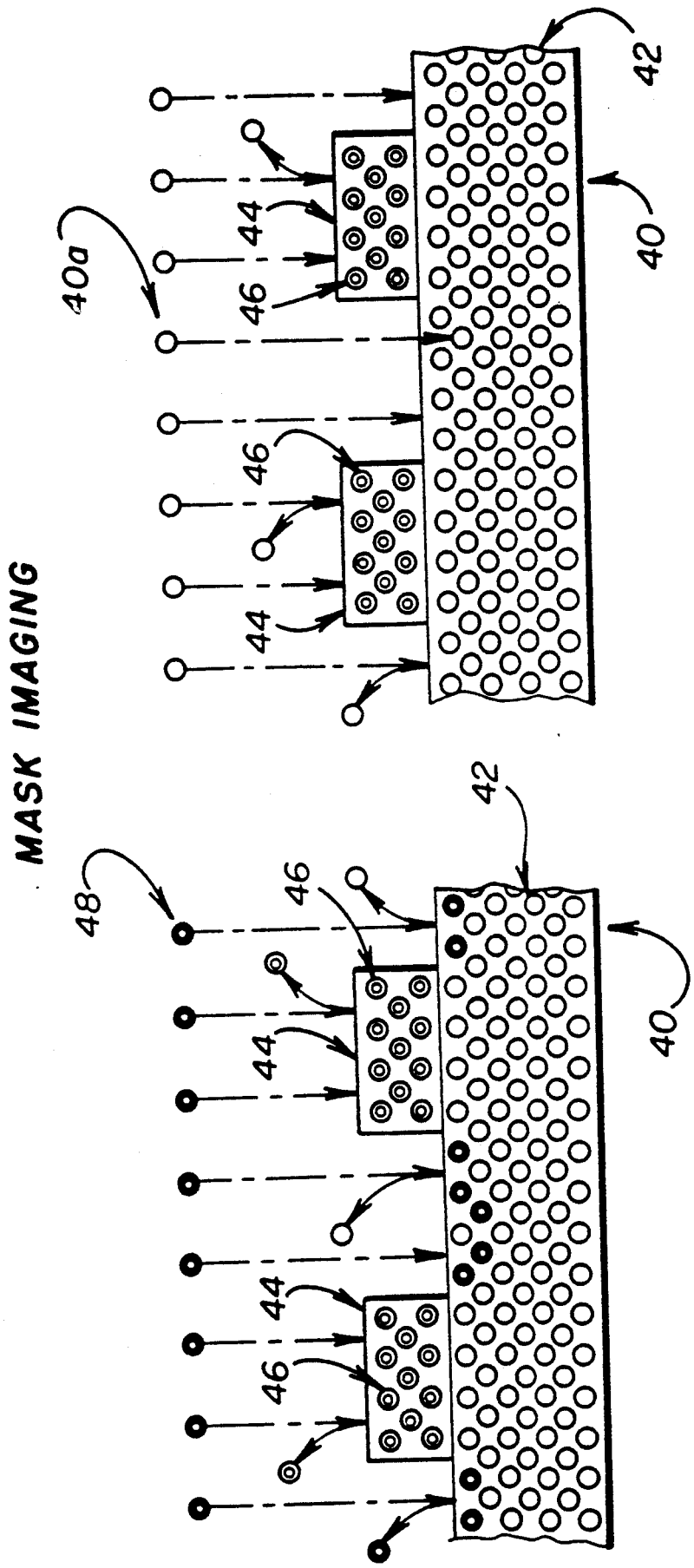

OPAQUE REPAIR

CLEAR REPAIR

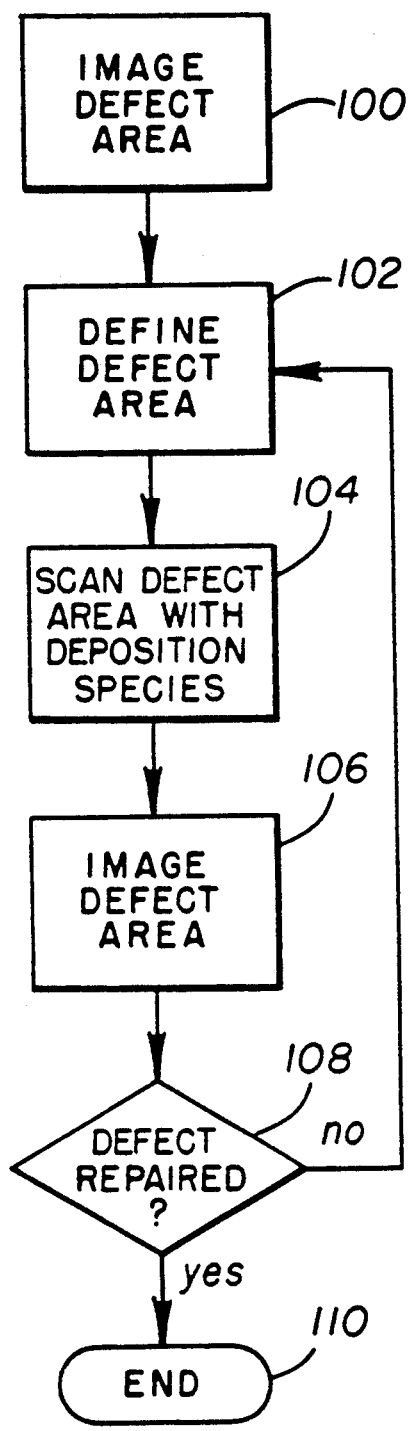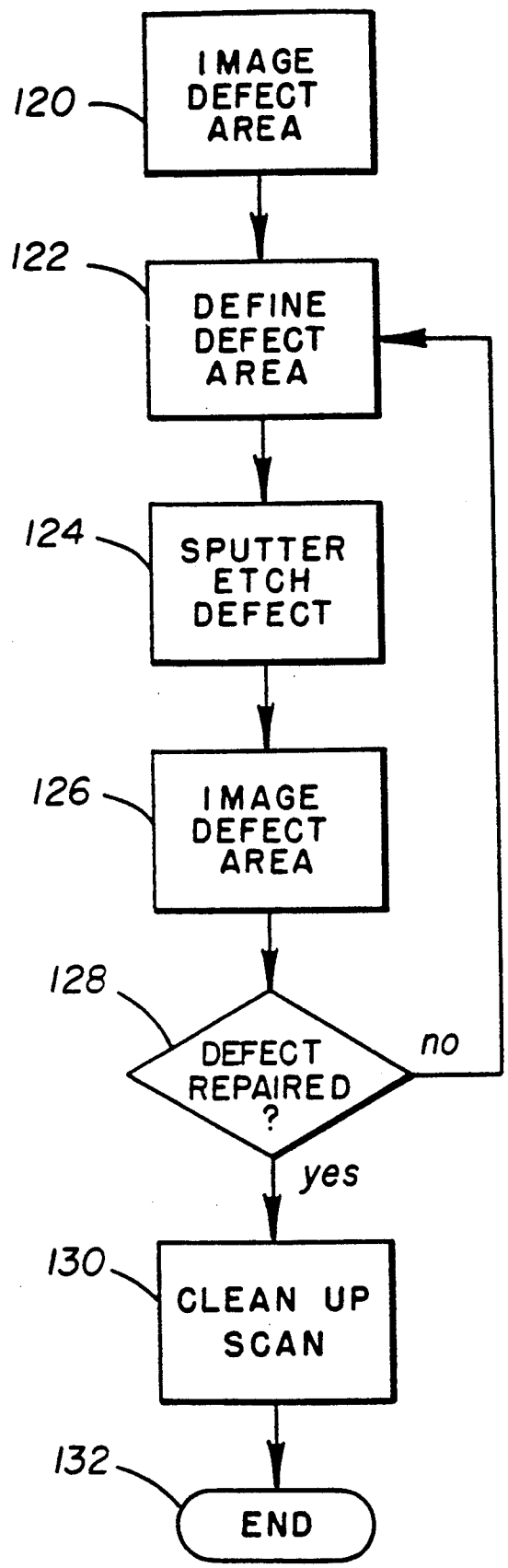
FIGURE 5a
FIGURE 5b

METHOD FOR REPAIRING SEMICONDUCTOR MASKS AND RETICLES

This is a division, of application Ser. No. 053,318, filed July 22, 1987, abandoned.

BACKGROUND OF THE INVENTION

1. Field of the Invention

The present invention relates to repair of semiconductor masks and reticles. More specifically the present invention relates to the use of a focused ion beam system which is capable of delivering, from a single ion beam column, several different species of ion beams, each of which is individually optimized to meet the differing requirements of the major functions to be performed in mask repair. These major functions are, mask imaging, which is the creation of an image of the microscopic structure of a region on the surface of a mask in order to locate the mask defect to be repaired; opaque defect repair which is the removal of material from the regions on the surface of the mask substrate where such material should be absent; and clear defect repair which is the deposition of opaque material onto undesired clear areas on the surface of the mask substrate.

2. The Prior Art

It is known to repair defects in photomasks by use of light and laser light. See for example U.S. Pat. No. 3,748,975 to Tarabocchia; U.S. Pat. No. 4,200,668 to Segal, et al.; PTC Application W081/03628 to Campy.

The use of light or laser light for the repair of semiconductor masks and reticles, while functioning adequately in some environments, presents problems, especially when smaller geometries, i.e., less than one micron, are encountered. The trend today in semiconductor circuit design is for increasingly smaller featured size, and the use of lasers for mask repair becomes disadvantageous because of the inability to focus the laser beam adequately to work with the smaller geometries, and because of the undesirable heating the laser beam causes in areas adjacent to the repair area.

The use of focused ion beams for mask repair is known. See, e.g., Wagner, *Applications of Focused Ion Beams to Microlithography*, Solid State Technology, May, 1983. Such prior art systems known to the inventors utilize a single ion beam species.

Representative of the prior art devices are the KLA/Micrion 808 and the Sieko SIR 1000 systems. Both systems are capable of delivering only a single type of focused ion beam species to the mask under repair, namely a gallium beam of between 35 to 50 keV in energy. Such a beam produces significant mask damage during imaging due to the beam's high sputter rate. In addition, significant amounts of gallium are implanted into the mask substrate during imaging and opaque defect repair, resulting in an effect called "gallium staining". This effect causes local reductions of the substrate's transparency which are prone to later identification as defects by industry-standard mask inspection equipment.

It is also known to repair clear defects by inducing deposition of an adherent carbon film from a hydrocarbon gas onto the mask surface by use of a focused ion beam. See, e.g., *Submicron Mask Repair Using Focused Ion Beam Technology*, SPIE, Vol. 632, Electron-Beam, X-Ray & Ion Beam Techniques For Submicrometer Lithographies V (1986).

While these prior art methods and systems attempt clear defect repair differently, they do not deposit into the clear defects a material compatible with the pre-existing metallic film forming opaque portions of the mask. Additionally, the Sieko system uses a chemical vapor deposition process which complicates system design and facilities requirements, whereas the KLA/Micrion system sputter etches the mask substrate with a gallium beam, which is very slow process and is irreversible.

BRIEF DESCRIPTION OF THE INVENTION

Apparatus is disclosed which may be used to repair opaque and transparent defects in semiconductor masks and reticles. An ion beam column which can produce a precisely focused ion beam with a beam diameter in the 0.1 to 0.5 micrometer range that can be operated at either a high voltage (such as 60 kV) or a low voltage (such as 4 kV) and can be rapidly switched between these voltages is one aspect of the present invention.

A liquid metal alloy source is utilized containing a plurality of appropriate atomic species. A low atomic mass element, such as silicon, is compatible with the mask substrate material. A metal to be deposited into clear defects which is compatible with the metallic film forming opaque portions of the mask is also used. A high atomic mass element which will produce a high sputter/etching rate of the metallic films to remove opaque defects is used.

A mass filter provides rapid selection of the atomic species that will remain in the focused ion beam when it reaches the mask. A mask holder is provided whose voltage can be varied from ground potential up to a voltage level nearly equal to the low voltage level at which the ion beam is produced, in order to precisely control the energy of the ion beam as it impinges upon the mask or reticle target.

A system and method according to the present invention operates as follows: to image the mask, the mass filter is set to select a beam of the low atomic mass element, and the ion column is set to produce a beam of an imaging species. The column is set to produce this imaging beam with the same column lens settings and target bias which will be used subsequently for the type of repair (clear or opaque) needed. Thus, clear defects are imaged with a high voltage low mass beam, while opaque defects are imaged with a low voltage, low mass beam. The resultant ion beam will cause minimum erosion of the mask due to its low atomic mass. Furthermore, any implanted beam atoms will not contaminate the mask since the atomic species is selected to be compatible with the mask substrate material.

To repair an opaque defect, a first beam is produced which removes the bulk of the undesired material, followed by a second beam which insures that the mask is left undamaged. The first beam is produced by setting the mass filter to select a beam of the high atomic mass element, setting the ion column to produce a high voltage beam, and setting the mask holder voltage to ground potential. The first beam will rapidly remove the metallic film in the opaque defect by sputter etching. When this film is largely removed, the system switches to the second beam which is produced by setting the mass filter to select a beam of low atomic mass element and leaving the ion column and mask holder voltages unchanged. The second beam has a sputter etching rate that is substantially lower than the primary beam but still high enough to remove in an acceptable time a very thin layer (about 0.01 micrometers) of material which will be contaminated by implanted atoms from the primary beam. Implanted atoms from the second beam will not contaminate the mask since the atomic species is selected to be compatible with the mask substrate material.

To repair a clear defect, the mass filter is set to select the desired metallic element, the ion column is set to produce a low voltage beam, and the mask holder voltage is raised to a level nearly equal to the beam voltage at the mask. The resultant ion beam will arrive at the mask with extremely low energies and will therefore be deposited onto the mask, thus filling in the clear defects. The metallic element is chosen to be compatible with the metallic film forming opaque portions of the mask to minimize the concern of introducing foreign substances into the mask.

BRIEF DESCRIPTION OF THE DRAWINGS

FIGS. 2a and 2b schematically illustrate the method of imaging a mask by use of prior art methods and the present invention, respectively.

FIGS. 5a and 5b are block diagrams illustrating the steps of the method of repairing clear defects and opaque defects, respectively.

DETAILED DESCRIPTION OF A PREFERRED EMBODIMENT

Figure 1:
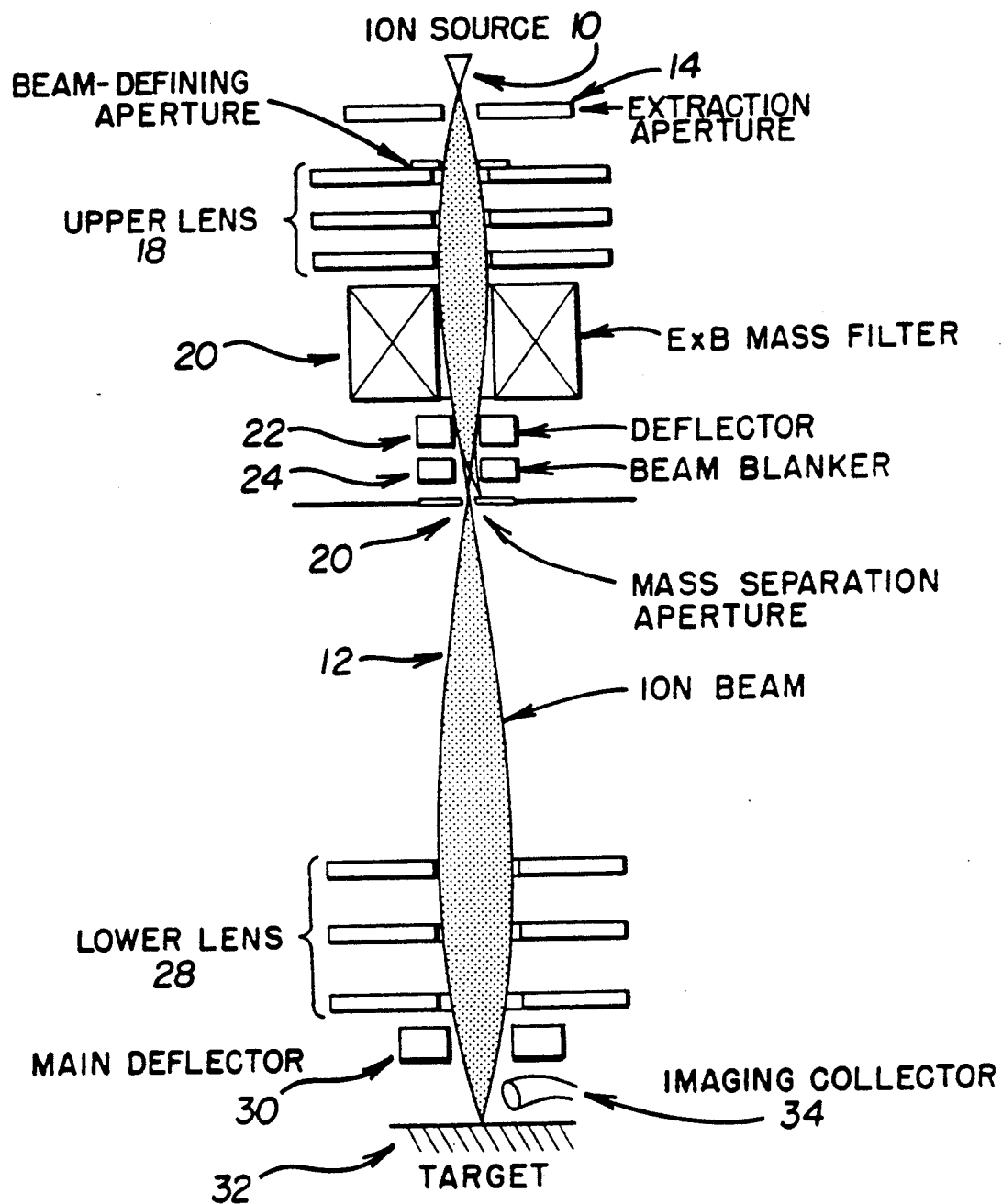
FIG. 1 is a schematic diagram of a focused ion beam column suitable for use in the present invention.

Referring first to FIG. 1, an apparatus 8 for producing focused ion beams according to the present invention is disclosed. Ion source 10 is a source for ion beam 12. Ion beam 12 first passes through extraction aperture 14, beam defining aperture 16, and upper lens assembly 18. Ion beam 12 then passes through mass filter 20, deflector 22, beam blanker 24 and mass separation aperture 26. The function of mass filter 20, deflector 22, beam blanker 24 and mass separator aperture 26 is to separate out a single selected atomic species from the mixed ion beam of atomic species provided by ion source 10. Ion beam 12 then continues through lower lens assembly 28 main deflector 30 onto semiconductor mask or reticle 32 to be repaired.

Ion source 10 is a standard liquid metal type such as those available from FEI Co., Hillsboro, Oreg.; V. G. Instruments, Inc., Stamford, Conn.; or MicroBeam, Inc., Newbury Park, Calif. This source is mounted in an ion gun structure which also supports extraction aperture 14. This gun is also a standard type available from the above suppliers. The diameter of beam-defining aperture 16 determines the total current in beam 12 as it enters the upper lens 18 and mass filter 20. This aperture will generally define a beam half-angle from 1 to 4 mRadians giving beam currents from 100 to 1,000 pA. Apertures are standard products available from Advanced Laser Systems, Waltham, Mass. and National Aperture, Lantana, Fla. The upper lens 18 forms an image of the ion source at the mask separation aperture 26. When the ExB mask filters 20 is activated, the magnetic field splits ion beam 12 into several spots at the mask separation aperture 26. With proper choice of the ExB electric field, the desired species in ion beam 12 will pass through the mass separation aperture and into lower lens 28. Those of ordinary skill in the art will readily understand how to balance the electric and magnetic fields of mass filter 20 to select the desired species.

Generally, lenses, mass filters, deflectors and blankers are not standard products. However, they are integral components of commercially available ion columns, such as those manufactured by MicroBeam, Inc., Newbury Park, Calif.; Ion Beam systems, Beverly, Mass.; JEOL, Boston, Mass. When the ion beam is not required for imaging, sputtering or deposition, it is deflected onto the mass separation aperture by beam blanker 24. This prevents undesirable exposure of the mask to the ion beam. Lower lens 28 is used to image the beam crossover formed at mass separation aperture 26 onto the surface of mask 32. Main deflector 30 scans the focused beam across the surface of mask 32. For imaging, the beam is generally scanned only in the defect areas. For defect removal, the beam is scanned only in the defect areas. Channeltron 34 collects either secondary electrons or secondary ions emitted from the target due to the impact of the focused ion beam. It may be a standard product supplied by Galileo Electro-Optics in Sturbridge, Mass. or Detector Technology, Brookfield, Mass.

Those of ordinary skill in the art will recognize that mask 32 will be mounted on a moveable stage in order to allow the defect to be repaired to be located properly with respect to ion beam 12. There are numerous means known in the art for performing this function, including precision x-y stages with travel in each of directions x and y, sufficient to position any area of the mask within the field of view of the focused ion beam to an accuracy of approximately 1 micron. The center of the field of view is the optical axis of the ion column, while its size is determined by the field strength and length of the main deflector 32 as is well-understood by those of ordinary skill in the art.

In a preferred embodiment, the ion source 10 may be a conventional ion source containing an alloy of chromium and silicon. Preferably, an ion source containing an alloy of chromium, silicon and a third species may be used. Those skilled in the art will realize that the third species may be gold, platinum, or palladium. Such an ion source will produce a mixed ion beam from which a single species may be selected by use of a mass filter 20 as is known by those skilled in the art.

In a preferred embodiment the proportion of the alloy constituents of the chromium/silicon/gold ion source may be from 20 to 45 atomic percent chromium, 20 to 55 atomic percent gold, with the remainder silicon. If a binary chromium/silicon alloy is used, preferred proportions of the alloy are from 40 to 70 atomic percent chromium. Fabrication of these alloys is familiar to those skilled in the art. Those of ordinary skill in the art will readily realize that two binary alloy ion sources may also be used. For example, a first binary allow ion source for use for imaging and sputtering can be used in combination with a second binary alloy ion source for use in imaging and deposition. Such an imaging and sputtering ion source would preferably be a silicon gold alloy, although silicon may be alloyed with another relatively heavy atom suitable for sputtering as will be appreciated by those of ordinary skill in the art.

The double ion source used for imaging and deposition may be a silicon/chromium alloy or a silicon/gold, silicon/platinum or silicon/palladium alloy. Those of ordinary skill in the art will also appreciate that beryllium could be used instead of silicon in either or both of the imaging/sputtering or imaging/deposition ion sources.

The function of the mass filter is to select between the imaging and repair ion beam species, as will be appreciated by those skilled in the art. A beam of ions for first imaging the mask or reticle to be repaired is necessary in order to assure that the ion beams which will be used for repairing both opaque and transparent defects will be directed towards the correct location on the mask or reticle.

The apparatus of the present invention may be used to repair opaque defects in masks by use of a sputtering process. A focused ion beam of the sputtering ion species is used at an energy of greater than 10 keV, preferably around 50 keV. Pre-repair imaging is also performed at the same energy level for accurate imaging. As will be appreciated by those skilled in the art, accuracy cannot be guaranteed if the imaging is performed at an energy appreciably different from the energy at which the sputtering is done.

For repairing clear defects the apparatus of the present invention deposits material on the mask 32. A focused ion beam is used at an energy at less than or equal to 1 keV, preferrably approximately 0.5 to 1.0 keV. Again, imaging is done at the same voltage to insure accuracy.

As those of ordinary skill in the art will be aware, it is preferable to neutralize the ion beam in order to prevent accumulated charge particles from repelling later ions trying to impinge upon the surface of the target mask or reticle. This neutralization preferably should take place after the last optical element in the system. A presently preferred method of neutralizing the ion beam is by using a device such as an electron beam flood gun as is known in the art, to flood the surface of the target mask with electrons. This technique is especially helpful when the material encountered on the surface of the mask is an insulator which would otherwise build up a significant amount of charge.

Imaging is performed using a species of scanning microscopy employing either secondary ions or secondary electrons. A collector 34 collects secondary particles for use in imaging, as is well known in the art. Techniques for imaging are well known and beyond the scope of the invention. It is presently preferred to use channel electron multipliers, made by Galileo Electro-Optics Corp, of Sturbridge, Mass. or Detector Technology of Brookfield, Mass. to perform imaging.

Figures 3A, 3B:
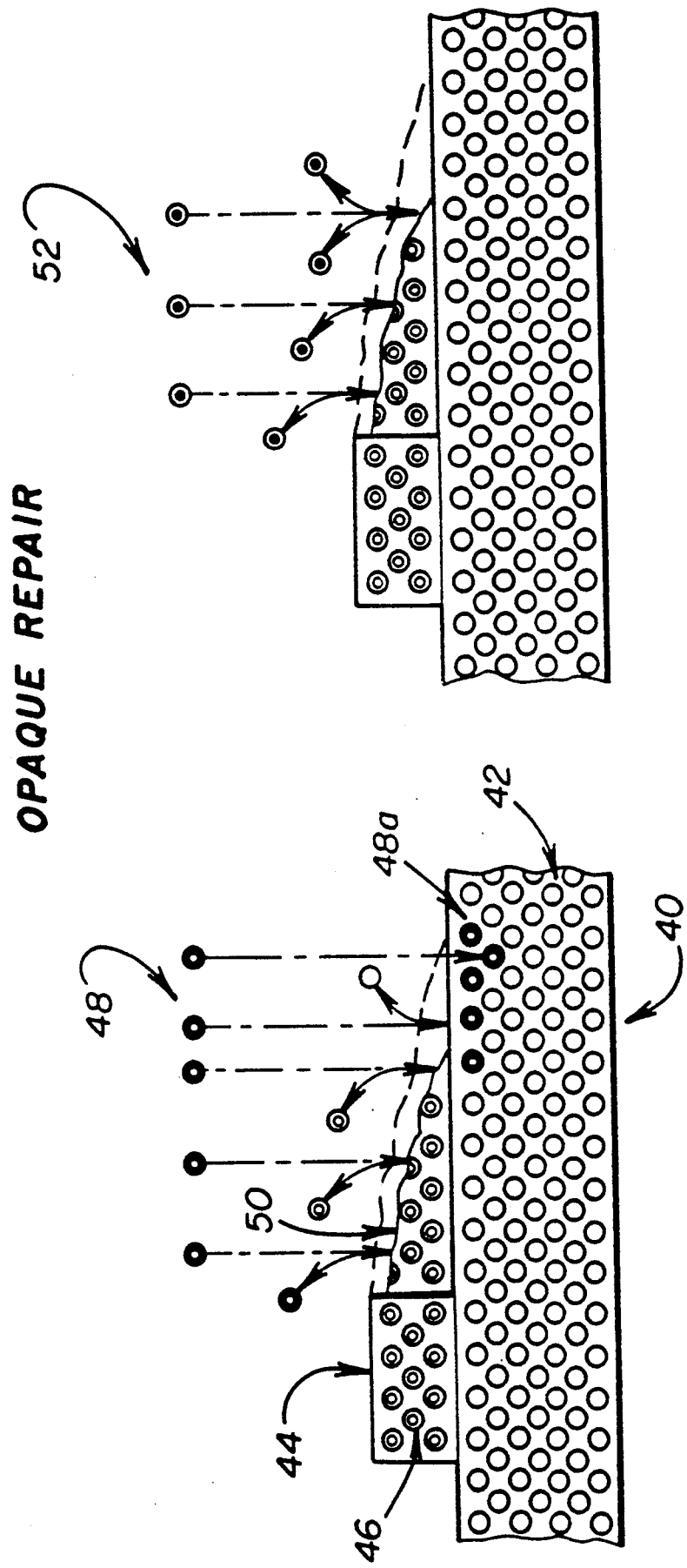
FIGS. 3a and 3b schematically illustrate the method of repairing opaque defects by use of prior art methods and the present invention, respectively.
Figure 4B:
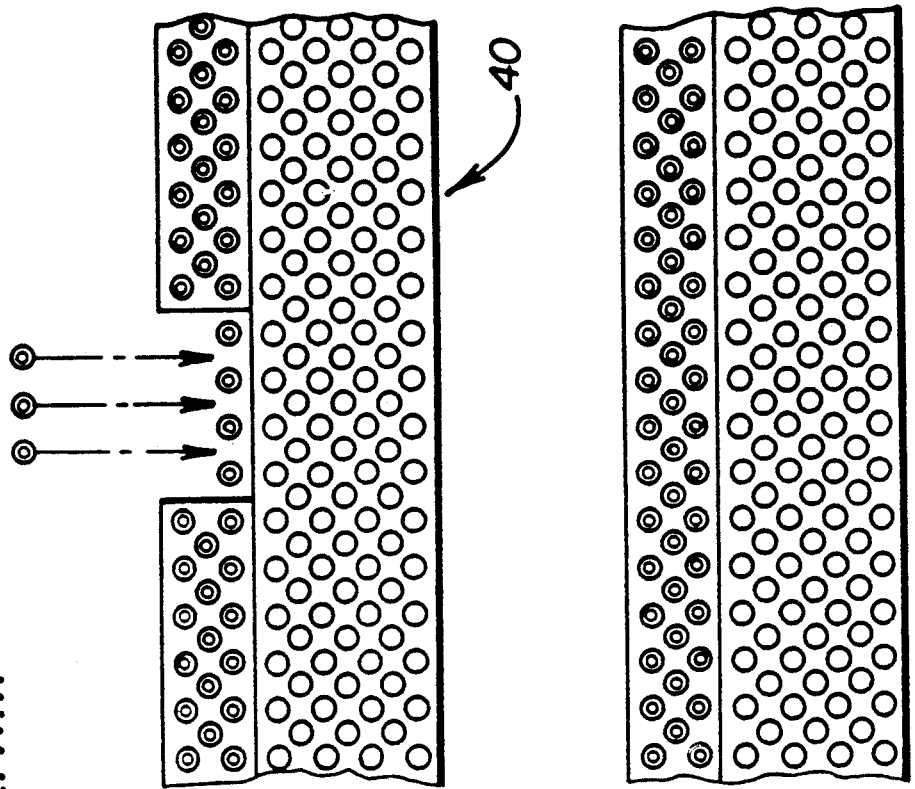
FIGS. 4a and 4b schematically illustrate the method of repairing clear defects by use of prior art methods and the present invention, respectively.
Figure 4A:
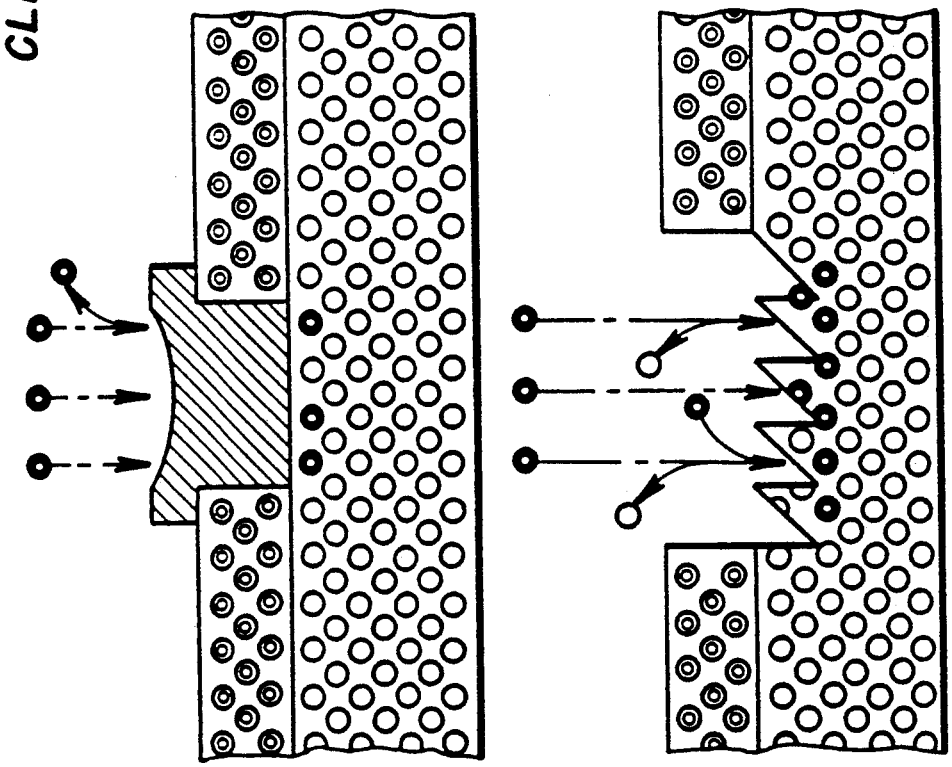

The operation of apparatus 8 for repairing mask defects will now be disclosed with reference to FIGS. 2 through 4. First, the mask to be repaired must be imaged, that is the defect to be repaired must be located and positioned under the focused ion beam 12. Mask imaging is depicted schematically in FIGS. 2a and 2b.

FIG. 2a shows mask imaging typically used in the prior art. Mask substrate 40 is shown made up of atoms 42 of a first atomic species, usually silicon. Opaque regions 44 are made up of atoms 46 of a second atomic species. Imaging species ions 48 are used, and result in contamination of mask substrate 40 as shown. To image the mask, mass filter 20 is set to select a beam element of low atomic mass element, the ion column is set to produce a low voltage beam, and the mask holder voltage is set to ground potential. The resultant beam will cause minimum erosion of the mask due to its low automic mass and its low voltage. Furthermore, any implanted beam atoms 40a will not contaminate the mask since the atomic species was selected to be compatible with the mask substrate material as shown in FIG. 2b.

Repair of opaque defects is disclosed with reference to FIGS. 3a and 3b. FIG. 3a shows how prior art methods are used with mask substrate 40, made up of atoms 42 of a first atomic species. Opaque region 44, made up of metallic atoms 46, is shown abutted by opaque defect region 50, also made up of metallic atoms 46. Gallium ions 48 are used to sputter etch region 50, resulting in gallium atoms 48a becoming embedded in substrate 40, thus causing contamination.

To repair an opaque defect, according to the method of the present invention, a first beam 52 of a species such as gold, is produced which removes the bulk of the undesired material and is followed by a second beam which ensures that the mask is left undamaged. The first beam is produced by setting the mass filter to select a beam of the high atomic mass element, selecting the ion column to produce a high voltage beam, and setting the mask holder voltage to ground potential. The first beam rapidly removes the material in the opaque defect by sputter etching. When the opaque defect is largely removed, the system switches to the second beam which is produced by setting the mass filter to select a beam of low atomic mass element and leaving the ion column and mass holder voltages unchanged. The second beam has a sputter etch rate substantially lower than the first beam but still high enough to remove in an acceptable time a very thin layer (about 0.01 micrometers) of material which will be contaminated by implanted atoms from the first beam.

The first beam removes material at a rate exceeding 20 square microns/minute assuming a thickness of 0.1 micron. The removal rate of the second beam is at least an order of magnitude smaller. For endpoint detection of the removed material, it is possible to use a mass analysis.

To repair a clear defect, the mass filter is set to select the metallic element, the ion column is set to produce a low voltage beam and the mask holder voltage is raised to a level nearly equal to the beam voltage at the mask. The resultant beam atoms will arrive at the mask with extremely low energies and will therefore be deposited onto the mask, thus filling in the clear defects. The metallic element is chosen to be compatible with the metallic film forming opaque portions of the mask to minimize the concern of introducing foreign substances onto the mask. In a preferred embodiment, the metallic element is chromium, however, those of ordinary skill in the art will recognize that where the mask to be repaired utilizes metal other than chromium to form opaque regions, appropriate other atomic species should be selected to minimize the introduction of foreign substances onto the mask surface.

Referring now to FIG. 5a, a preferred embodiment of the method of repairing clear defects will be disclosed. First, as shown at 100, the defect area on the mask is imaged with a single rasterscan using a low voltage silicon beam. Those of ordinary skill in the art will realize that after scanning a continual display using a stored image on a video screen may be utilized. Various pieces of equipment, known to those skilled in the art, are commercially available for these purposes. Next, at 102, the operator of the equipment defines the defect area to be repaired. This definition may be made by means of a mouse or other computer-aided techniques, beyond the scope of this invention, which may be employed to automatically move the beam to the desired areas of the defect. Next, at 104, the defect area is scanned with a chromium beam to deposit chromium in the clear defect area. The chromium bean is deposited at the low voltage level. The defect area is then imaged again, as shown at 106, in order to determine whether the defect has been repaired. A decision is made, at 108, resulting in the red-defining of the defect area for further scanning, if the defect has not been repaired. If the defect has been repaired, the process is complete at 110.

Referring now to FIG. 5b, a preferred embodiment of the method for repairing an opaque defect is set forth in flow chart form. First, at 120, the image defect area is scanned. However, unlike the scanning performed when a clear defect is to be repaired, this image is scanned with a high voltage silicon beam in order that the imaging and repair be done at the same voltage to ensure accurate imaging. Next, at 122, the operator defined the defect area in the same manner in which the defect area was defined with respect to repairing a clear defect. The defect is then sputter etched, at 124, using a high voltage gold beam and the defect is then imaged again, at 126, to determine whether the defect has been completely repaired. At 128, the decision is made whether the defect has been completely repaired. If not, the process of defining the defect area, at 122, is repeated. If the defect has been repaired, however, a clean-up scan using high voltage silicon, shown at 130, is performed to remove any gold which has been deposited into the mask substrate. The process, as shown at 132, then ends.

A preferred embodiment of both apparatus and methods for repairing defects in semiconductor masks or reticles has been disclosed. Those of ordinary skill in the art will recognize that, while particular embodiments have been shown, that equivalents will readily suggest themselves. It is the intent of the inventors to limit the invention only by the scope of the appended claims.

What is claimed is:

1. A method for repairing an opaque defect in a semiconductor mask or reticle, said semiconductor mask or reticle comprising a first, clear, substrate material on the surface of which a pattern of a second opaque material has been deposited, including the steps of:
    (a) creating an image of the area on said mask or reticle containing said opaque defect with a first focused ion beam comprised of a first ion species, said first ion species compatible with said first material,
    (b) defining the area of said opaque defect,
    (c) sputter etching the area of said opaque defect using a second ion beam of a second ion species, said second ion species having a relatively high atomic weight compared to said first ion species,
    (d) creating an image of the area on said mask or reticle where said opaque defect was located using a focused ion beam comprised of said first ion species,
    (e) determining whether said opaque defect has been repaired,
    (f) repeating steps (a) through (e) if said opaque defect has not been repaired,
    (g) scanning the area of said opaque defect with a focused ion beam comprised of said first ion species for a time sufficient to remove the surface layer of material from the surface of said substrate material which is contaminated by ions of said second species if said opaque defect has been repaired.

2. The method of claim 1 wherein said first focused ion beam comprises an ion species chosen from the group containing silicon and beryllium, and wherein said second focused ion beam comprises an ion species chosen from the group containing chromium, platinum, or palladium.

3. A method for repairing an opaque defect in a semiconductor mask or reticle, said semiconductor mask or reticle comprising a first, clear, substrate material on the surface of which a pattern of a second opaque material has been deposited, including the steps of:
    (a) defining the area of said opaque defect,
    (b) sputter etching said area with a focussed ion beam comprised of an ion species having a relatively higher atomic weight compared to that of said substrate material,
    (c) sputter etching said area with a focussed ion beam comprised of an ion species compatible with the material from said substrate material.

4. A method of repairing an opaque defect in a semiconductor mask or reticle, including the steps of:
    (a) creating an image of the region on said mask or reticle containing said opaque defect with a first focused ion beam comprised of silicon ions at an energy in the range of 10 keV to 50 keV,
    (b) defining the area of said opaque defect,
    (c) sputter etching said area using a second focused ion beam comprised of gold ions at an energy in the range of 10 keV to 50 keV,
    (d) creating an image of the region on said mask or reticle where said opaque defect was located using said first focused ion beam at an energy in the range of 10 keV to 50 keV,
    (e) determine whether said opaque defect has been repaired,
    (f) repeating steps a through e if said opaque defect has not been repaired,
    (g) scanning said area with said first focused ion beam at an energy in the range of 10 keV to 50 keV if said opaque defect has been repaired.

* * * * *